United States Patent
Chow

(10) Patent No.: US 7,698,669 B1
(45) Date of Patent: Apr. 13, 2010

(54) METHOD AND SYSTEM TO EVALUATE OPERATIONAL CHARACTERISTICS OF AN ELECTRONIC CIRCUIT

(75) Inventor: Daniel Tun Lai Chow, Foster City, CA (US)

(73) Assignee: Altera Corporation, San Jose, CA (US)

( * ) Notice: Subject to any disclaimer, the term of this patent is extended or adjusted under 35 U.S.C. 154(b) by 178 days.

(21) Appl. No.: 11/747,873

(22) Filed: May 11, 2007

(51) Int. Cl.
G06F 17/50 (2006.01)
(52) U.S. Cl. .................... 716/4; 716/5; 716/6; 702/124; 702/125; 702/126; 324/436; 707/1; 707/102; 707/205; 369/30.18; 369/30.19; 369/30.21; 369/30.27
(58) Field of Classification Search ................. 716/4–6; 702/124–126, 66–68; 324/436, 76.11; 707/1, 707/102, 205; 369/30.18, 30.19, 30.21, 30.27
See application file for complete search history.

(56) References Cited

U.S. PATENT DOCUMENTS

| 5,343,405 | A | 8/1994 | Kucera et al. | |
|---|---|---|---|---|
| 5,895,461 | A * | 4/1999 | De La Huerga et al. | ......... 707/1 |
| 6,003,047 | A | 12/1999 | Osmond et al. | |
| 6,248,946 | B1 | 6/2001 | Dwek | |
| 6,594,599 | B1 * | 7/2003 | Kent et al. | ..................... 702/84 |
| 6,728,311 | B1 | 4/2004 | Waschura et al. | |
| 6,810,346 | B2 * | 10/2004 | Nygaard et al. | ............. 702/117 |
| 6,928,433 | B2 | 8/2005 | Goodman et al. | |
| 7,362,836 | B2 * | 4/2008 | Nygaard, Jr. | ................ 375/355 |
| 2003/0165259 | A1 * | 9/2003 | Balent et al. | ................ 382/113 |
| 2006/0047449 | A1 * | 3/2006 | Petersen et al. | ............... 702/68 |
| 2008/0080389 | A1 * | 4/2008 | Hart et al. | .................... 370/252 |

* cited by examiner

Primary Examiner—Thuan Do
Assistant Examiner—Nghia M Doan
(74) Attorney, Agent, or Firm—Martine Penilla & Gencarella, LLP

(57) ABSTRACT

The present invention is directed to a method and a system to evaluate operational characteristics of an electronic circuit. The method includes generating a visual display, on a monitor, of an eye diagram viewer. The eye diagram viewer is used to establish a test parameter for the circuit. Accessed is data that includes a graphical file containing eye diagram information corresponding to the test parameter. A visually perceivable image of the eye diagram information is provided in response to the test parameter. Specifically, the eye diagram viewer is used to establish an eye diagram information identifier by displaying in a plurality of test condition selector screens one of a multiple condition values for the test condition parameters. The graphical file containing the eye diagram information corresponding to the eye diagram information identifier is obtained from the server and displayed.

19 Claims, 11 Drawing Sheets

METHOD AND SYSTEM TO EVALUATE OPERATIONAL CHARACTERISTICS OF AN ELECTRONIC CIRCUIT

BACKGROUND

This invention relates to an apparatus and a method for analyzing operation of an electronic circuit and, more particularly, for analyzing the operation of an electronic circuit using eye diagrams.

One way by which to determine the operational characteristics of an electronic circuit is by evaluating a stream of pulse coded signals, often referred to as a bit stream, which is produced by the electronic circuit. A bit stream is usually binary coded pulse signals represented by zeros and ones that may be electrical voltages or optical signals derived from the electrical voltages, created by the electronic circuit and monitored with an oscilloscope. The signal displayed on the oscilloscope that results from the bit streams is referred to as an "eye diagram".

The eye diagram is made from thousands of voltage samples taken over a period of time that reveal the quality of the measured bit streams. In an eye diagram the high and low states of the signal appear as substantially horizontal traces across the oscilloscope screen. State transitions are not completely random. Each transition potentially occurs relative to a conversion clock signal. Thus, if a state transition occurs, it happens at a known time relative to the conversion clock signal. By triggering the oscilloscope with the conversion clock signal, the state transitions of the communication signal appear at substantially the same locations on the oscilloscope display. The resulting pattern is an open area, the eye, bounded on the top and bottom by the high and low state levels, respectively, and on each side by state transition traces. The state transitions on each side of the opening generally cross and form an "X" shape on each side of the eye. One component of each "X" shape corresponds to high-to-low transitions and the other component corresponds to low-to-high transitions. The distance between the high and low states, the slope of the state transition, overall size of the open area, and other similar measurements aid in characterizing the operation of the electronic circuit producing the eye pattern.

Typically the operational characteristics of an electronic circuit are evaluated with a myriad different inputs stimuli and a myriad of different output conditions. The result is that several hundred to several thousand eye diagrams may be generated to properly assess the operational characteristics of an electronic circuit.

A need exists, therefore, to provide a method and system to ascertain the operational characteristics of an electronic circuit employing eye diagrams.

SUMMARY

It should be appreciated that the present invention can be implemented in numerous ways, such as a process and a system. Several inventive embodiments of the present invention are described below. The present invention is directed to a method and a system to evaluate operational characteristics of an electronic circuit. The method includes generating a visual display, on a monitor, of an eye diagram viewer. The eye diagram viewer is used to establish one or more test parameters for the circuit. Accessed is data that includes a graphical file containing eye diagram information corresponding to the test condition parameters. A visually perceivable image of the eye diagram information is provided in response to the test condition parameters. Specifically, the eye diagram viewer is used to establish an eye diagram information identifier by displaying in a plurality of data entry regions one of a multiple condition values for the test parameter. The graphical file containing the eye diagram information corresponding to the eye diagram information identifier is obtained from the server and displayed. The system carries out the functions of the method. These and other aspects of the invention will become apparent from the following detailed description, taken in conjunction with the accompanying drawings, illustrating by way of example the principles of the invention.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1:
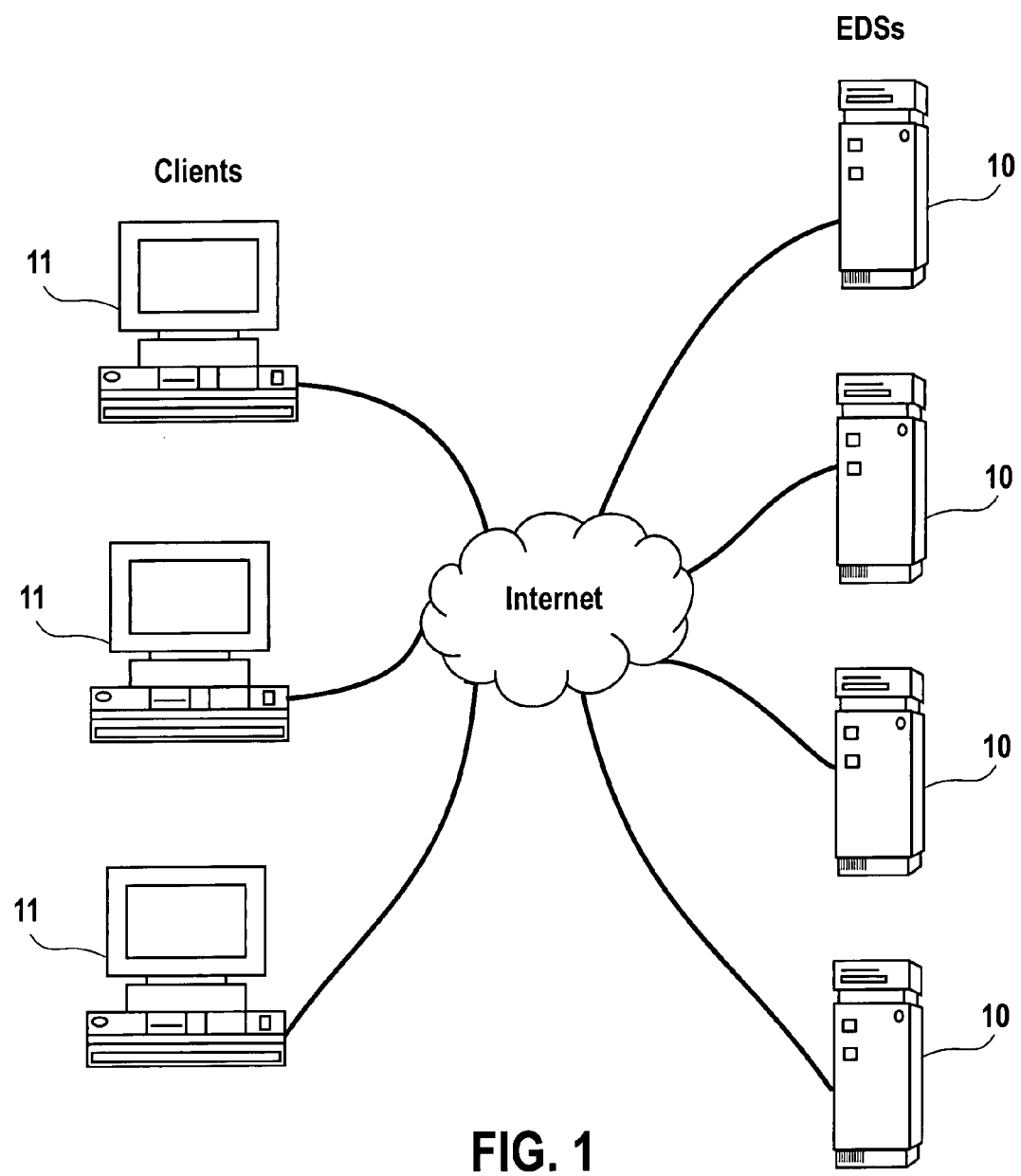
FIG. 1 is an illustration of a system in accordance with one embodiment of the present invention.

Referring to FIG. 1, although the instant invention may be practiced upon a stand-alone general processing computer system, the invention is discussed with respect to implementation using a network, such as a larger area network, e.g., the Internet, which includes a plurality of networked "eye diagram servers (EDSs) 10 that are accessible by "client terminals" 11. Communication between the EDSs 10 and the client terminals 11 typically occurs over a publicly accessible network, such as a public switched telephone network over ASDL telephone lines or large bandwidth trunks, such as T1 or OC3 service. The client terminals 11 access various EDSs 10 through an Internet service provider, e.g., AOL®, COMCAST®, EARTHLINK®, and the like, by executing application specific software, commonly referred to as a "browser", discussed more fully below with respect to FIG. 4.

Figure 2:
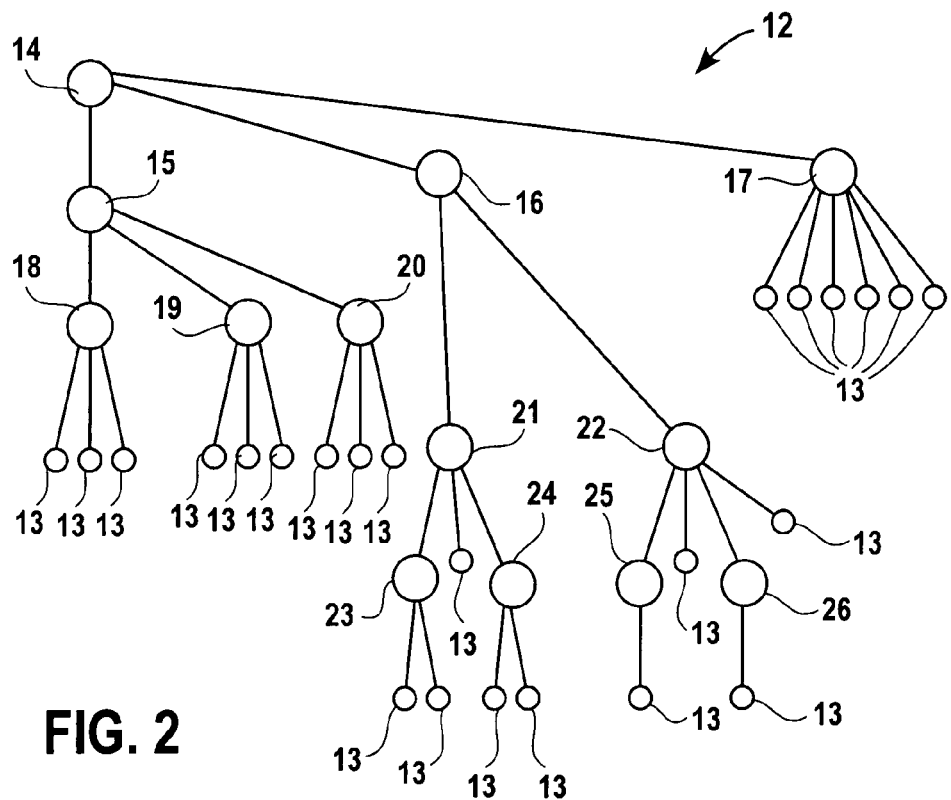
FIG. 2 is a schematic diagram of a tree data structure used to store graphical files on the eye diagram servers shown in FIG. 1, in accordance with one embodiment of the present invention.

Referring to both FIGS. 1 and 2, one or more of EDSs 10 include a database 12 of computer-readable instructions stored on a hard drive (not shown) thereof to permit access to graphical files 13, also referred to as eye diagram files (EDF) 13. Each EDF 13 contains eye diagram information for an electronic circuit (not shown). Specifically, database 12 is one example of the organization of data on EDSs 10, referred to as a tree structure to facilitate readily accessing EDFs 13 by one of client terminals 11 based upon desired set of test conditions used to evaluate the operational characteristics of the electronic circuit (not shown). For example, node 14 is typically a root node, with nodes 15, 16 and 17 each corresponding to differing operating conditions that may assume different values, 18, 19, and 21. As a result, in one embodiment each of nodes 15, 16 and 17 may correspond to a particular file folder name on EDS 10. As a result the EDFs 13 may be stored among a plurality of file folders on EDS 10. Node 18, 19, 20, 21 and 22 may correspond to a particular name of an EDF 13. Specifically, operating conditions 15 may have three condition values 18, 19 and 20, and operating condition 16 may have two values 21 and 22. It may also be the case wherein EDF 13 accessed based upon the value at node 21 is also dependent upon a condition value, e.g., at node 18, corresponding to operating conditions represented by node 15, which is represented by node 23. Similarly, EDF 13 associated with operating condition 16 may be accessed based upon value 24, which represents the value represented by node 19 corresponding to operating condition 15. Thus, the same EDF 13 may be present multiple times in database 12. It should also be understood that database 12 is an example and may, in practice, containing may more operating condition than shown by nodes 15, 16 and 17, as well as many more condition values than represented.

Figure 3:
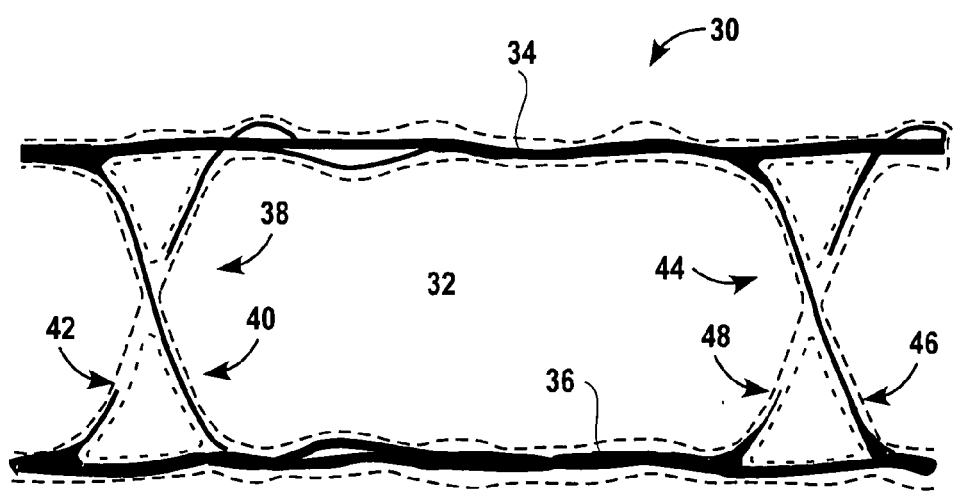
FIG. 3 is eye diagram information contained in the graphical file shown in FIG. 2 in accordance with one embodiment of the present invention.

Referring to both FIGS. 2 and 3, each EDF 13 contains information concerning an eye diagram pattern (EDP) 30. As shown, EDP 30 includes an eye 32 bounded above by high voltage state 34 and below by low voltage state 36. A first transition state region 38 preceding eye 32 includes a high-to-low transition path 40 and a low-to-high transition path 42. A second transition state region 44 following eye 32 includes a high-to-low transition path 46 and a low-to-high transition path 48. Several portions of EDP 30 may be significant in characterizing operation of an electronic circuit (not shown) producing the same. For example, a vertical position of high voltage state 34 and low voltage state 36 correspond to the amplitudes of these states. Once values for high and low voltage states 34 and 36 are obtained, several further points of interest may be derived, as is well known in the art. The features of EDP 30 are dependent not only upon the electronic circuit (not shown) being undergoing analysis, but the input signals, as well as output and ambient conditions of the test. As a result, there may be several thousand files of EDPs 30 that correspond to thousands of different shapes of eye diagrams.

Figure 4:
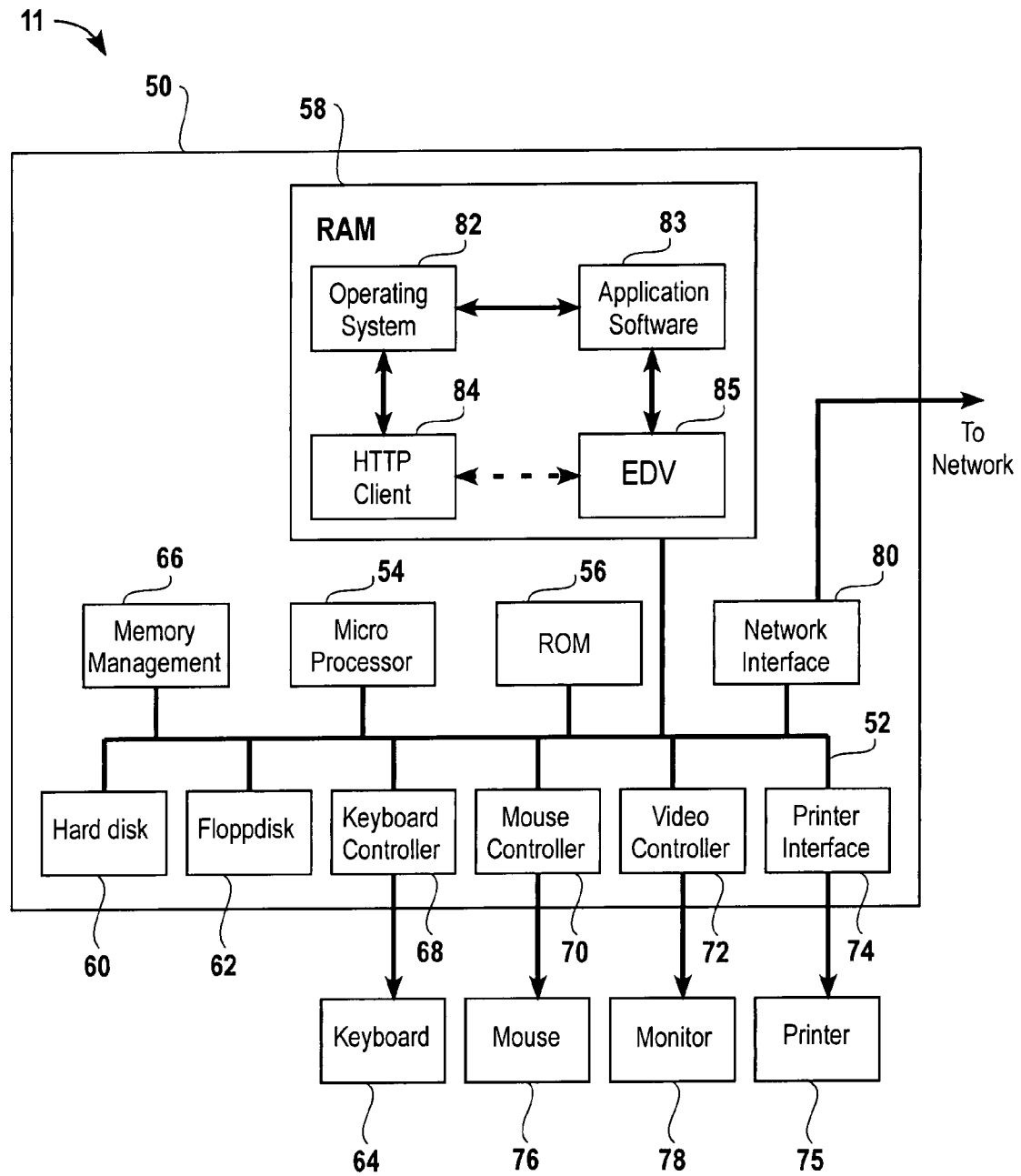
FIG. 4 a schematic view of a client computer shown in FIG. 1 in accordance with one embodiment of the present invention.

Referring to both FIGS. 1 and 4, to access information on EDSs 10, each client 11 includes a computer 50 that has one or more system buses 52 placing various components of the computer 50 in data communication. For example, a microprocessor 54 is placed in data communication with both a read only memory (ROM) 56 and a random access memory (RAM) 58 via the system bus 52. ROM 56 contains among other code, the Basic Input-Output system (BIOS) which controls basic hardware operation such as the interaction with peripheral components such as disk drives 60 and 62, as well as the keyboard 64. The RAM 58 is the main memory into which the operating system and application programs are loaded and affords the requisite size memory space. The memory management chip 66 is in data communication with the system bus 62 to control direct memory access (DMA) operations. DMA operations include passing data between the RAM 28 and the hard disk drive 60 and the floppy disk drive 62. Also in data communication with the system bus 62 are various I/O controllers: a keyboard controller 68, a mouse controller 70, a video controller 72, and a printer interface 74. The keyboard controller 68 provides a hardware interface for the keyboard 66, the mouse controller 70 provides the hardware interface for a mouse 76, or other point and click device, and the video controller 72 provides a hardware interface for a monitor 78. Printer interface 74 provides a hardware interface for printer 75. A network interface 80 enables data communication over the network. RAM 58 typically includes an operating system 82 resident therein. The operating system 82 of the computer 14 may be MAC OS®, UNIX®, WINDOWS® XP®, or other known operating system. In the present example, system 82 is WINDOWS® XP®. In data communication with operating system 82 are a number of application specific software, such as a text editor, mail client, database, and the like, shown generally as application software 83. Also in data communication with operating system 82 is an HTTP client 84 that may be selectively placed in data communication with an EDS 10. To that end, a similar, if not identical computer 50, may be included in one or more of EDSs 10.

Referring to FIGS. 1, 2 and 4, one embodiment of the present invention allows transmission of eye diagram information contained in EDFs 13 over the Internet employing HTTP client 84 utilizing a TCP/IP connection to pass a print request to one of EDSs 10 running an HTTP "service" (under the WINDOWS operating system) or a "daemon" under the UNIX operating system or other suitable software, depending upon the operating system. In the present example, a request for transmission of EDFs 13, i.e., a graphical file request (GFR), is typically achieved by contacting an HTTP server (not shown) included in an EDS 10 at a suitable universal resource locator (URL) address. In one embodiment of the present invention, the HTTP server (not shown) of one of EDSs 10 may respond to request for communication from one of clients 11 by sending a "web page" formatted as an HTML file. The HTTP client 84 interprets the HTML file and may form a visual representation of the same using local resources, e.g., fonts and colors and a specific implementation of an HTTP client known as a browser (not shown) and produce EDV 85.

Figure 5:
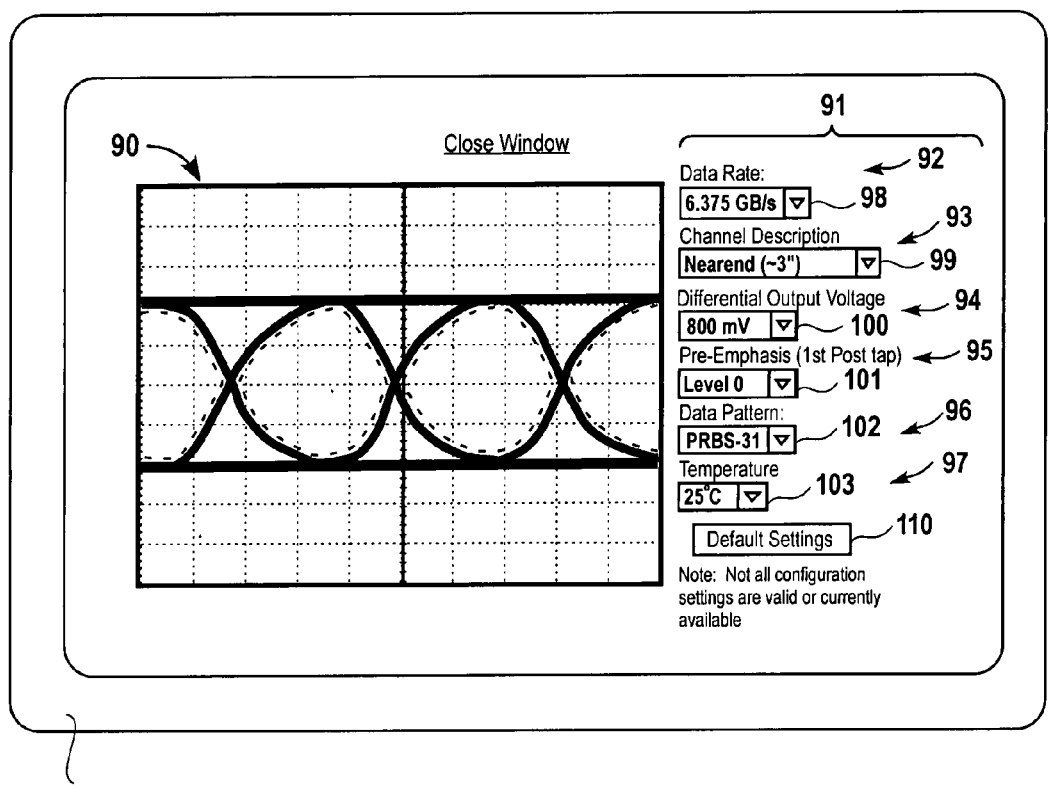
FIG. 5 is simplified plan view of an eye diagram viewer (EDV) that is displayed on a monitor of a client computer in accordance with one embodiment of the present invention.

Referring to both FIGS. 4 and 5, a request is generated by EDV 85. To that end, application software 83 facilitates activation of EDV 85 by establishing a connection with one of EDSs 10, as discussed above. In response the EDS 10 included in the connection transmits an HTML page which provides a visually perceivable EDV 85 on monitor 78. EDV 85 includes a display region 90 and a test parameter region 91. Display region 90 is the portion of EDV 85 in which graphical information associated with EDFs 13 is rendered. Test parameter region 91 includes multiple data entry regions (DER) 92-97 each corresponding to a different set of operating conditions, three of which are represented by nodes 15, 16 and 17 in FIG. 2.

Referring again to FIGS. 4 and 5, DER 92 and DER 95 both correspond to characteristics of an input signal (not shown) to the electronic circuit (not shown). DER 92 corresponds to the data rate of a signal input into the electronic circuit under test (not shown); and DER 95 corresponds to a predetermine distortion of the input signal. DER 93 and DER 943 correspond to output condition; DER 93 corresponds to the length from the electronic circuit output (not shown) at which point an output of the same is measured; and DER 94 corresponds to a differential output voltage at which the output is measured. DER 96 corresponds to the operating state of the electronic circuit (not shown) and DER 97 corresponds to ambient operating conditions of the electronic circuit (not shown).

Figure 6:
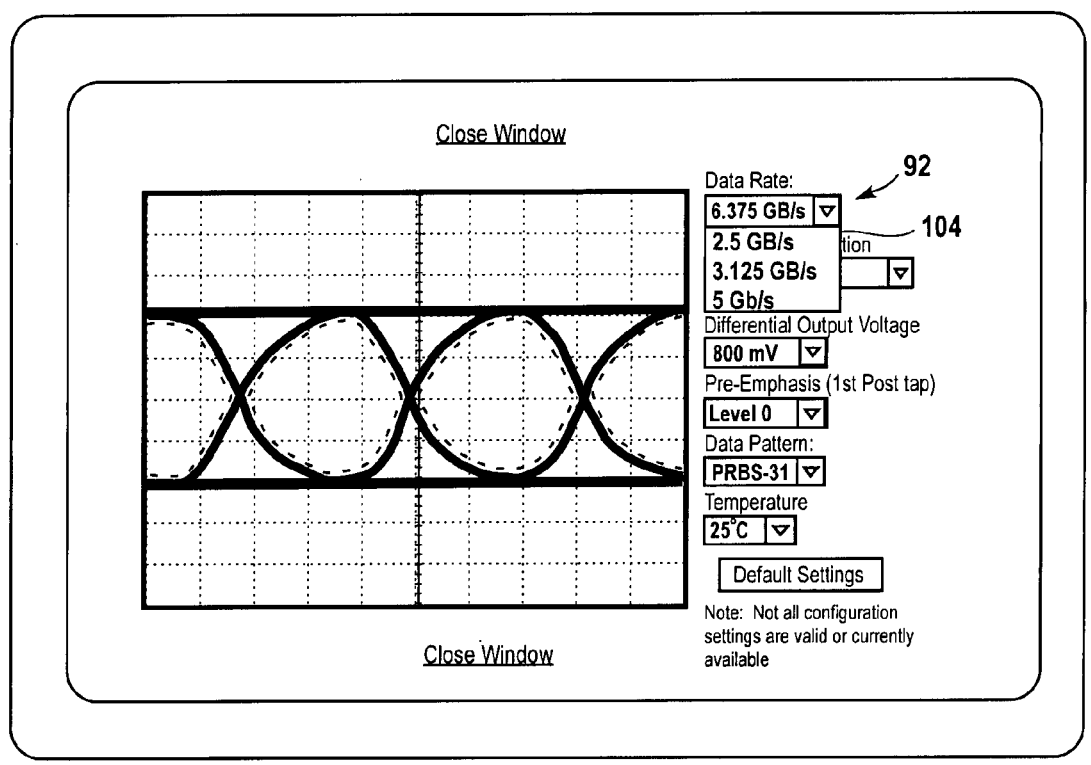
FIG. 6 is simplified plan view of the EDV shown in FIG. 5 with one of the data entry regions expanded to shown a set of condition values.
Figure 7:
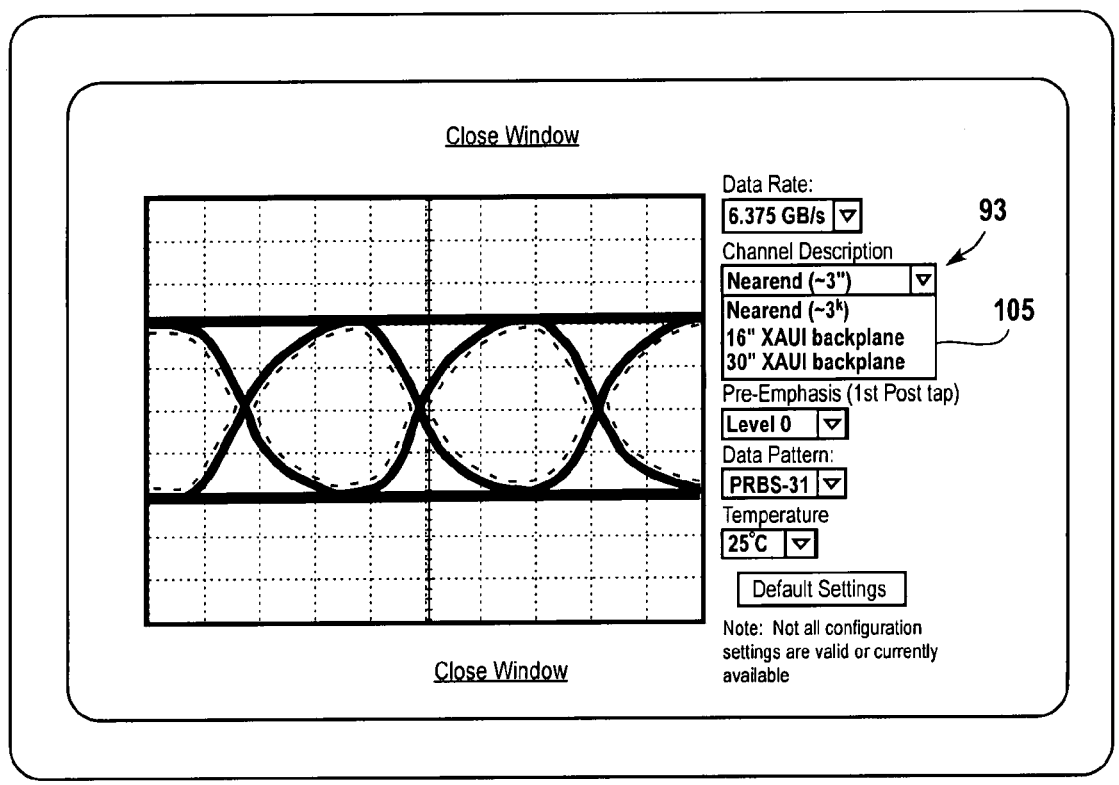
FIG. 7 is simplified plan view of the EDV shown in FIG. 5 with another one of the data entry regions expanded to shown another set of condition values.
Figure 8:
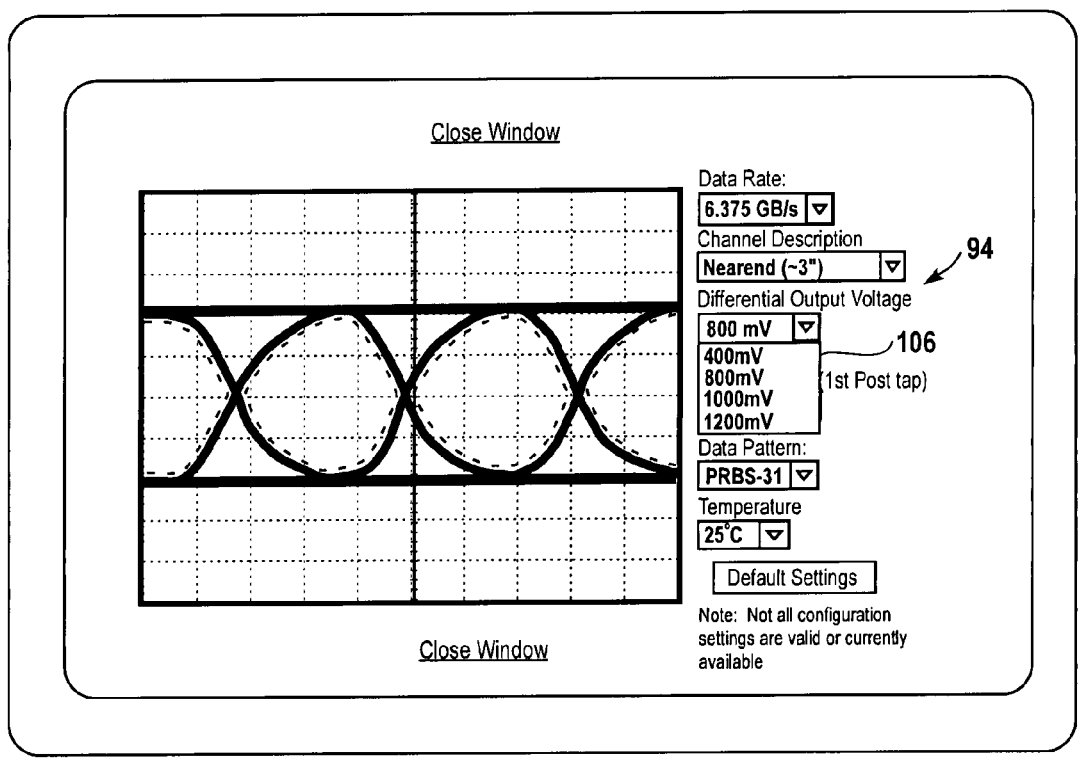
FIG. 8 is simplified plan view of the EDV shown in FIG. 5 with another one of the data entry regions expanded to shown another set of condition values.
Figure 9:
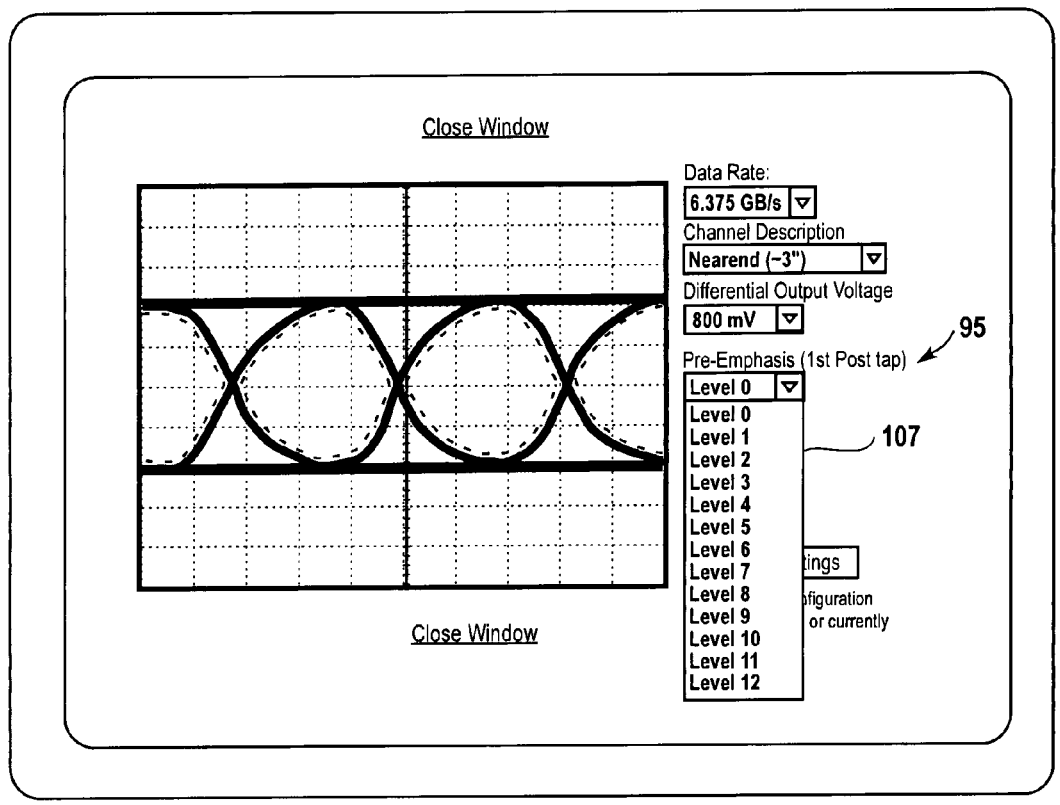
FIG. 9 is simplified plan view of the EDV shown in FIG. 5 with another one of the data entry regions expanded to shown another set of condition values.
Figure 10:
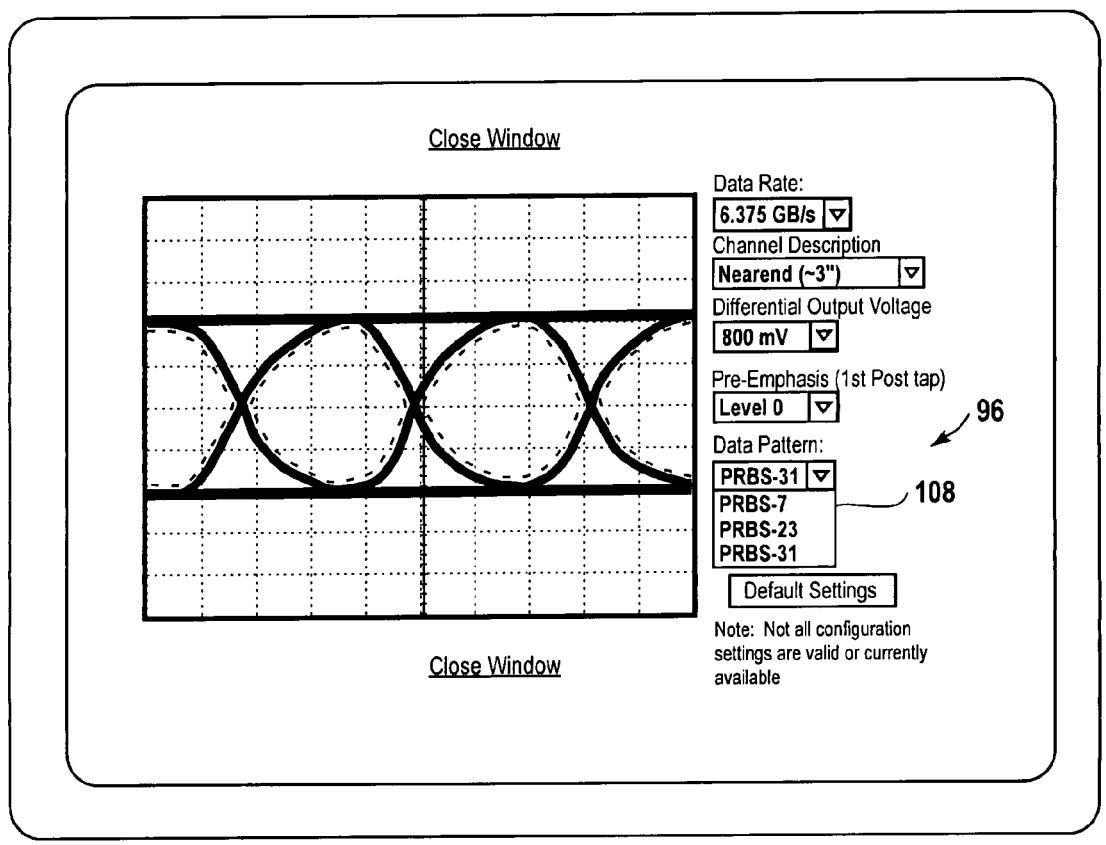
FIG. 10 is simplified plan view of the EDV shown in FIG. 5 with another one of the data entry regions expanded to shown another set of condition values.
Figure 11:
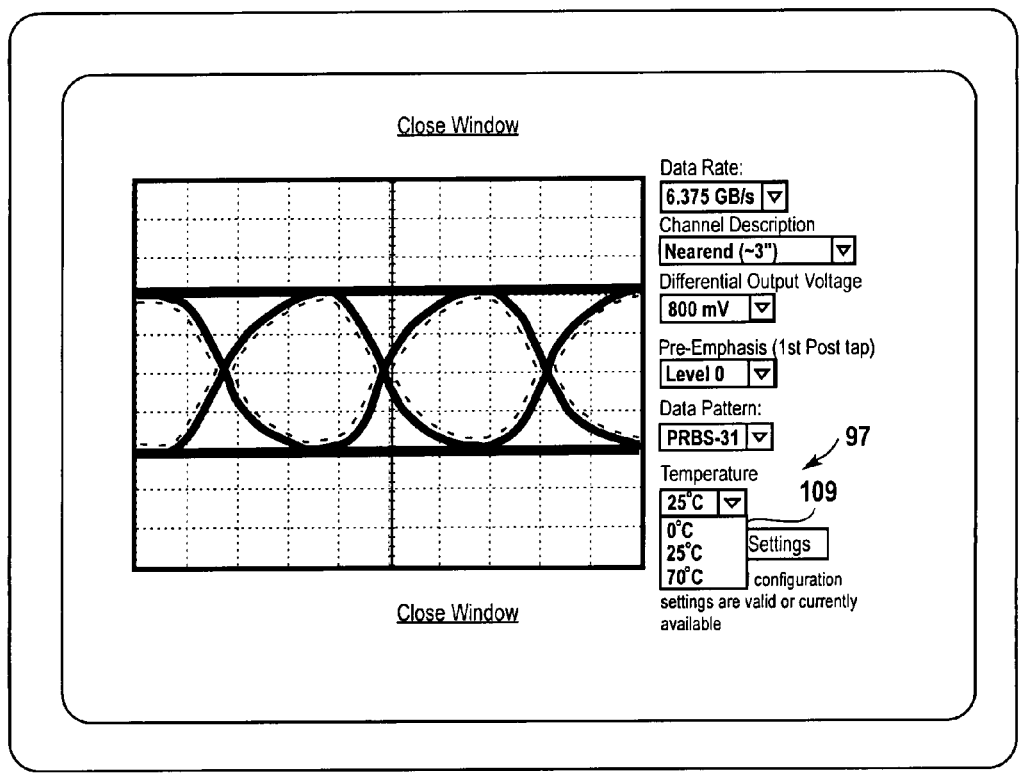
FIG. 11 is simplified plan view of the EDV shown in FIG. 5 with another one of the data entry regions expanded to shown another set of condition values.
Figure 12:
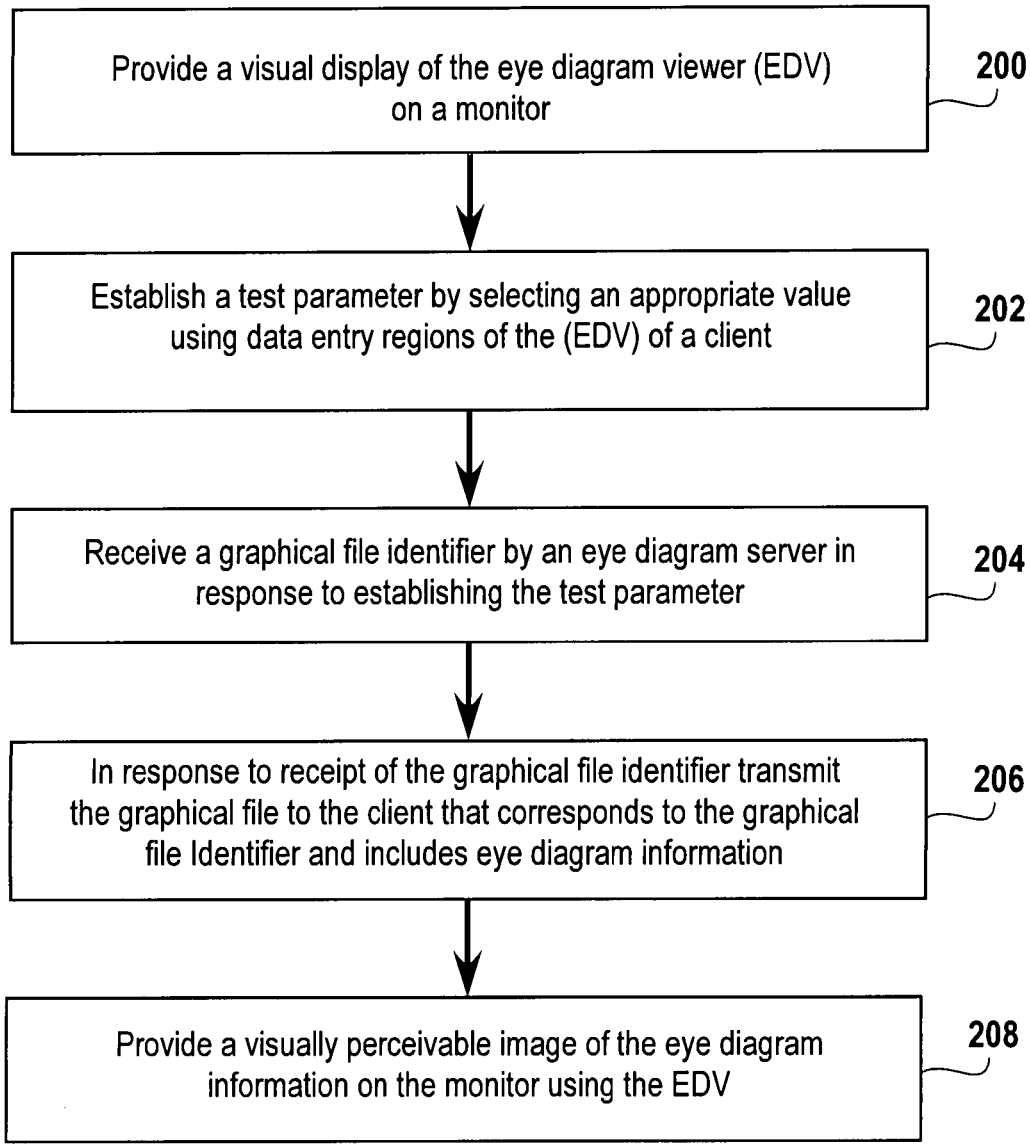
FIG. 12 is a flow diagram showing access to eye diagram information contained in an eye diagram server by a client shown in FIG. 1 in accordance with the present invention.

Each of DER 92-97 is a pull down menu that may be activated by using a virtual button contained therein and shown as 98-103, respectively. Each of DERs 92-97 includes set of condition values shown as 104 for DER 92, in FIG. 6; 105 for DER 93, in FIG. 7; 106 for DER 94, in FIG. 8; 107 for DER 95, in FIG. 9; 106 for DER 96, in FIG. 10; and 109 for DER 97, in FIG. 11. Each of the set of condition values include multiple condition values for the operating conditions as shown discussed with respect to DER 97 that includes a set 109 of condition values 110, 111 and 112 being 0° C., 25° C. and 70° C., respectively. As a result, condition values 110, 111 and 112 may correspond to nodes 18, 19 and 20 of data base 12, shown in FIG. 2, with the understanding that operating conditions 103 corresponds to node 15.

Also included in test parameter region 91, of FIG. 5, is a DEFAULT SETTINGS virtual button 110 that facilitates resetting each of the condition values in DERs 92-97 to a default setting by activating the same. A test parameter is defined by the set of values displayed by DER 92-97. In other words, a set of condition values for the operating conditions represented by DER 92-97 define the test parameter.

In operation, a visual display of EDV 85 is provided on monitor 78 at function 200. At function 202 a test parameter is established by selecting an appropriate value for each DER 92-97. At function 204, the test parameter information is received by one of EDSs 10. Specifically, in response to establishing the test parameter, a graphical file identifier is generated, which is computer-readable code that may be interpreted by one or more of EDSs 10. The graphical file identifier may include a specific file name and/or a path to the file and the specific file name. Regardless of the graphical file identifier employed, the graphical file will contain eye diagram information corresponding to the test parameter. In response to receipt of the graphical file identifier, the one of EDSs 10 transmit a graphical file contain eye diagram information corresponding thereto, i.e., corresponding to the test parameter viewed in EDV 85 of client 11, at function 206. At function 208 a visually perceivable image of the eye diagram information is provided in monitor 78, Although the foregoing invention has been described in some detail for purposes of clarity of understanding, it will be apparent that certain changes and modifications may be practiced within the scope of the appended claims. Accordingly, the present embodiments described above are to be considered as illustrative and not restrictive, and the invention is not to be limited to the details given herein, but may defined by the appended claims, including full scope of equivalents thereof.

What is claimed is:

1. A method to evaluate operational characteristics of an electronic circuit, said method comprising:
    storing a plurality of graphical files on a database in a plurality of folders, each folder corresponding to a condition from a plurality of conditions used for setting a test parameter of the electronic circuit, each folder containing a subset of the plurality of graphical files, each graphical file including eye diagram information resulting from a test of the electronic circuit using the test parameter;
    generating a visual display, on a monitor, of an eye diagram viewer which includes an eye diagram display region and a test parameter region the generating further including,
    displaying in the test parameter region multiple data entry regions, each data entry region corresponding to a condition from the plurality of conditions, and
    providing in each data entry region a plurality of different condition values associated with the corresponding condition;
    selecting a folder based on the values for the conditions of the test parameter;
    accessing, from the database, the graphical file in the selected folder, an identifier of the graphical file corresponding to said values for the conditions; and
    changing the eye diagram display region to display an eye diagram of said eye diagram information in the accessed graphical file, wherein each operation of the method is executed by a processor.

2. The method as recited in claim 1 wherein selecting a folder further includes choosing one of the different condition values for each of the conditions.

3. The method as recited in claim 2 wherein accessing further includes,
    determining an identifier of the graphical file by choosing from the selected folder an identifier corresponding to the chosen condition values.

4. The method as recited in claim 3 wherein accessing further includes providing said identifier with information consisting essentially of a name of said graphical file.

5. The method as recited in claim 3 wherein accessing further includes providing said identifier with information consisting essentially of a name of a path on said database where said graphical file is stored.

6. The method as recited in claim 3 wherein accessing further includes providing said identifier with information consisting essentially of a name of a path to a folder on said server where said graphical file is stored and a name of said graphical file.

7. The method as recited in claim 3 wherein accessing further includes transmitting said identifier to said server over a network.

8. The method as recited in claim 1, wherein storing the plurality of graphical files further includes,
    storing a first folder corresponding to a first condition inside a second folder corresponding to a second condition, wherein the graphical files in the first folder correspond to values associated with the first and second conditions.

9. A method to evaluate operational characteristics of an electronic circuit, said method comprising:
    storing a plurality of graphical files on a server in a plurality of folders, each folder corresponding to a condition from a plurality of conditions, each folder containing a subset of the plurality of graphical files, each graphical file including eye diagram information resulting from a test of the electronic circuit;
    generating a visual display, on a monitor, of an eye diagram viewer, said eye diagram viewer including an eye diagram display region a test parameter region which includes and a plurality of data entry regions each of which corresponding to a condition from a plurality of conditions and including a list of multiple condition values for a corresponding condition;

establishing, with said eye diagram viewer, a graphical file identifier based on chosen condition values in said plurality of data entry regions selected from one of said multiple condition values; and changing the eye diagram display region to display an eye diagram of the eye diagram information from the graphical file with the established identifier, the graphical file being accessed from said server, wherein each operation of the method is executed by a processor.

10. The method as recited in claim 9 further including transmitting said identifier to said server over a network.

11. The method as recited in claim 10 wherein establishing further includes providing said identifier with information consisting essentially of a name of said graphical file.

12. The method as recited in claim 10 wherein establishing further includes providing said identifier with information consisting essentially of a name of a path on said server where said graphical file is stored.

13. The method as recited in claim 10 wherein establishing further includes providing said identifier with information consisting essentially of a name of a path to a folder on said server where said graphical file is stored and a name of said graphical file.

14. A system to evaluate operational characteristics of an electronic circuit, said system comprising:
- a client processor;
- a database, in data communication with said client processor, storing a plurality of graphical files in a plurality of folders, each folder corresponding to a condition from a plurality of conditions, each folder containing a subset of the plurality of graphical files, each graphical file including eye diagram information resulting from a test of the electronic circuit;
- a display, in data communication with said client processor; and
- a client memory, in data communication with said client processor and storing a computer program to be operated on by said client processor, said computer program including,
    - a first sub-routine to generate a visual display, on said display, of an eye diagram viewer, said eye diagram viewer including an eye diagram display region and a test parameter region which includes a plurality of data entry regions, each of which corresponding to a condition from a plurality of conditions and including a list of multiple condition values for the corresponding condition,
    - a second sub-routine to establish, with said eye diagram viewer, a graphical file identifier based upon chosen condition values in said plurality of data entry regions, and
    - a third sub-routine to change the eye diagram display region to display an eye diagram of the eye diagram information from the graphical file with the established identifier, the graphical file being accessed from said database.

15. The system as recited in claim 14 wherein said third-subroutine further includes computer-readable instructions to transmit said identifier to said database over a network.

16. The system as recited in claim 14 wherein said third-subroutine further includes computer-readable instructions to transmit said identifier to said server over the Internet using a Hypertext Transfer Protocol (HTTP) protocol.

17. The system as recited in claim 14 wherein said second sub-routine further includes computer-readable instructions to provide said identifier with information consisting essentially of a name of said graphical file.

18. The system as recited in claim 14 wherein said second sub-subroutine further includes computer-readable instructions to provide said identifier with information consisting essentially of a name of a path on said server where said graphical file is stored.

19. The system as recited in claim 14 wherein said second sub-routine further includes computer-readable instruction to provide said identifier with information consisting essentially of a name of a path to a folder on said server where said graphical file is stored and a name of said graphical file.

* * * * *